(12) United States Patent
Akaishi et al.

(10) Patent No.: US 6,207,518 B1
(45) Date of Patent: Mar. 27, 2001

(54) METHOD OF MANUFACTURING SEMICONDUCTOR DEVICE

(75) Inventors: Yumiko Akaishi; Shuichi Kikuchi, both of Gunma (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/512,524

(22) Filed: Feb. 24, 2000

(30) Foreign Application Priority Data

Mar. 12, 1999 (JP) .................................................. 11-066871

(51) Int. Cl.[7] .................................................. H01L 21/336
(52) U.S. Cl. .......................... 438/301; 438/305; 438/306; 438/307
(58) Field of Search .................................. 438/301, 305, 438/306, 307, 297

(56) References Cited

U.S. PATENT DOCUMENTS 5,541,123 * 7/1996 Williams et al. .

FOREIGN PATENT DOCUMENTS

| 537684 | * | 4/1993 | (EP) . |
| 802567 | * | 10/1997 | (EP) . |
| WO8403997 | * | 10/1984 | (WO) . |

* cited by examiner

*Primary Examiner*—Trung Dang
(74) *Attorney, Agent, or Firm*—Fish & Richardson P.C.

(57) ABSTRACT

Disclosed is a method of manufacturing a semiconductor device which includes a source region, a channel region, a drain region, a gate electrode formed on the channel region through a gate insulating film 6 and a drift region (N⁻ layer 22) formed between the channel region and the drain region, wherein the process of forming the drift region (N⁻ layer) comprises the steps of: ion-implanting and diffusing at least two kinds of second conduction type impurities (e.g. phosphorus and arsenic ions) having different diffusion coefficients in a P-type well region 21; ion-implanting at least one kind first conduction type impurities (e.g. boron ions) having a diffusion coefficient substantially equal to or larger than that of at least one of said second conduction type impurities (e.g. phosphorus); and diffusing the first conduction type impurities after the gate insulating film 6 has been formed.

13 Claims, 4 Drawing Sheets

US 6,207,518 B1

METHOD OF MANUFACTURING SEMICONDUCTOR DEVICE

BACKGROUND OF THE INVENTION

1. Field of the Invention

The present invention relates to a semiconductor device and a method of manufacturing it, and more particularly to LD (Lateral Double Diffused) MOS transistor technology which is used for a high voltage element for e.g. liquid crystal driving IC.

2. Description of the Related Art

Now, an LDMOS transistor structure refers to a structure in which impurities with a different conduction type are diffused in a diffused region formed on surface of a semiconductor substrate to form another diffused region and a difference in the horizontal diffusion between these diffused regions is employed as an effective channel length. This structure, in which a short channel is formed, can constitute an element with low "on" resistance.

FIG. 10 is a sectional view for explaining a conventional LDMOS transistor which are being developed by the inventors of the invention. A N-channel LDMOS transistor structure is illustrated. Although the structure of a P-channel LDMOS transistor structure is not explained here, it is well known that the same structure can be adopted except for its conduction type.

In FIG. 10A, reference numeral 1 denotes a semiconductor substrate with a first conduction type, e.g. P-type, and reference numeral 21 denotes a P-type well region. A P-type body region 3 is formed within the P-type well region 21. An N-type diffused region 4 is formed within the P-type body region 3. Another N-type diffused region 5 is formed apart from the N-type diffused region 4. A gate electrode 7 is formed on the surface of the substrate 1 through a gate insulating film 6. A channel region 8 is formed in the surface region of the P-type body region 3 immediately below the gate electrode.

The N-type diffused region 4 is used as a source region whereas the N-type diffused region is used as a drain region. A drift region (N⁻ layer 22) is formed which is composed of a shallow region (first N⁻ layer 22A) below the gate electrode 7 and deep region (second N⁻ layer 22B) in the vicinity of the drain region. Further, a source electrode and drain electrode (not shown) are formed on the surface so as to contact with source and drain region, respectively. A P-type diffused region 12 for assuming the potential of the P-type body region 3 is formed through an interlayer insulating film.

In the above LDMOS transistor, which has a high impurity concentration on the surface of the N-type drift region, a current is apt to flow in the surface of the N-type drift region, thereby realizing a high withstand voltage. The LDMOS transistor having such a configuration is referred to as a surface relax type (RESURF)LDMOS.

However, since the impurity concentration is high in the surface of the N-type drift region 22, the P-type body region 3 cannot diffuse sufficiently. Therefore, as shown in FIG. 10B, the edge of the P-type body region 3 approaches the source region (N-type diffused region 4) so that the channel region B may be not be formed to have a suitable size and impurity concentration(see indicated arrow).

The inventors of the invention tried to solve the above problem by rearranging the manufacturing steps and eventually completed the present invention. Specifically, in the conventional process, the drift region (N⁻ layer 22) was formed in such a manner that at least two N-type impurities (phosphorus ions or arsenic ions) with different diffusion coefficients are ion-implanted and diffused in the surface layer of the P-type well region 21, and thereafter P-type impurities (boron ions) are ion-implanted and diffused into the surface layer of the P-type well region 21 where the source region is to be formed so that the boron ions thus diffused cancel the phosphorous ions of the second N⁻ layer 22B (diffused layer originating from phosphorus ions) formed at a relatively deep position of the P-type well region of the source region.

However, the following fact was confirmed. The drift region (N⁻ layer 22), after it has been formed, is subjected to thermal oxidation to form a gate insulating film 6. Therefore, arsenic ions contained in the first N⁻ layer (with arsenicions diffused) are segregated on the substrate surface. Because of the segregated arsenic ions, the P-type body region does not diffuse sufficiently so that the channel region 8 cannot be formed to have a suitable size (see a hatched region showing segregated ions in the graph of FIG. 9).

SUMMARY OF THE INVENTION

An object of the invention is to provide a method of manufacturing a semiconductor device which can satisfy the requirements of a high withstand voltage and reduced "on" resistance.

Namely the present invention intends to reduce a defect of channel caused by the segregation of the impurity ion for forming a drift region in a semiconductor device having the drift region near the channel region, thereby a reliable LDMOS type transistor can be obtained.

In order to achieve the above object, in accordance with the invention, there is provided a method of manufacturing a semiconductor device which includes a source region 4, a channel region 8 and a drain region 5, a gate electrode 7 formed on the channel region through a gate insulating film 6 and a drift region (N⁻ layer 22) formed between the channel region and the drain region, wherein the process of forming the drift region (N⁻ layer) comprises the steps of: ion-implanting and diffusing at least two kinds of second conduction type impurities (e.g. phosphorus and arsenic ions) having different diffusion coefficients in a P-type well region 21; ion-implanting at least one kind first conduction type impurities (e.g. boron ions) having a diffusion coefficient substantially equal to or larger than that of at least one of said second conduction type impurities (e.g. phosphorus); and diffusing the first conduction type impurities after the gate insulating film 6 has been formed.

Preferably, the step of diffusing the first conduction type impurities is executed after a film for forming said gate electrode (polysilicon film 17) has been formed.

In accordance with the invention, since the first conduction type impurities for forming a drift region with the first conduction type are diffused after the thermal oxidation for forming the gate insulating film, it is possible to solve the problem that the body region with the first conduction type does not diffuse sufficiently owing to a drift region with the second conduction type, thereby permitting a suitable channel region to be formed and providing a semiconductor device which can satisfy the requirement of high withstand voltage and reduced "on" resistance.

In addition, where the step of diffusing the first conduction type impurities for forming the drift region with the first conduction type is executed before the film for forming a gate electrode is made conductive, it is possible to solve the problem that the temperature of the viscous flow of the gate insulting film is made lower than that of the normal viscous flow by the impurities used to make conductive the film for forming the gate electrode, and hence while the first conduction type impurities are diffused, the gate insulating film of $SiO_2$ film is exposed to an atmosphere of the higher temperature than the temperature when the viscous flow occurs, thereby avoiding the occurrence of the phenomenon of reducing the withstand voltage of the oxide film.

The above and other objects and features of the invention will be more apparent from the following description taken in conjunction with the accompanying drawings.

DESCRIPTION OF THE PREFERRED EMBODIMENTS

Figure 1:
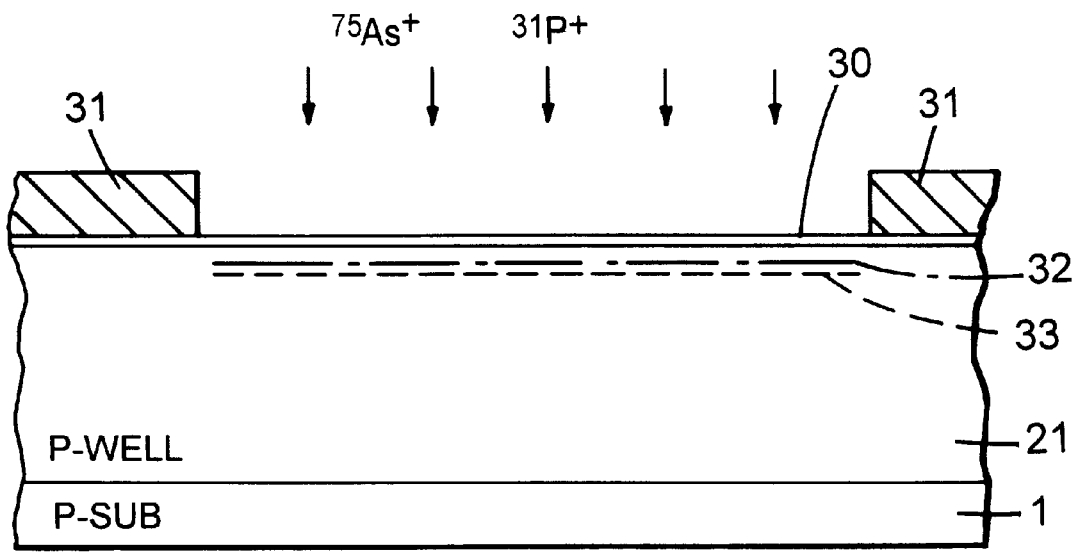
FIGS. 1 to 8 are sectional views for explaining a method of manufacturing a semiconductor device according to an embodiment of the invention.

Now referring to the drawings, an explanation will be given of an embodiment of a method of manufacturing a semiconductor device according to the invention. FIGS. 1 to 8 are sectional views for explaining a manufacturing process of a semiconductor device according to an embodiment of the invention.

Figure 10A:
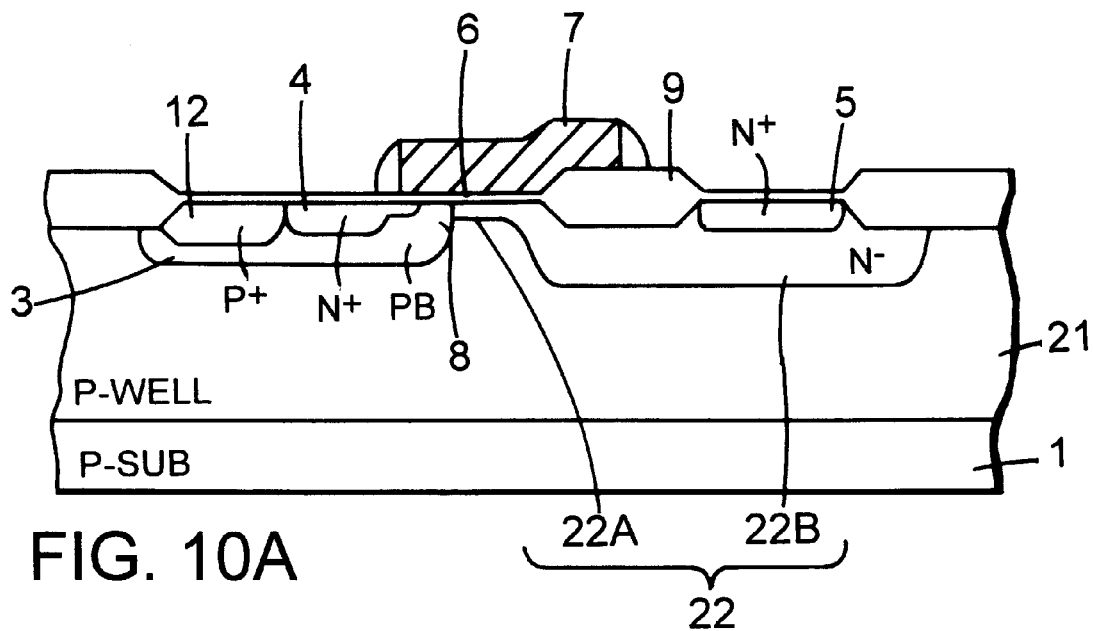
FIG. 10 is a sectional view of a conventional semiconductor device.
Figure 10B:
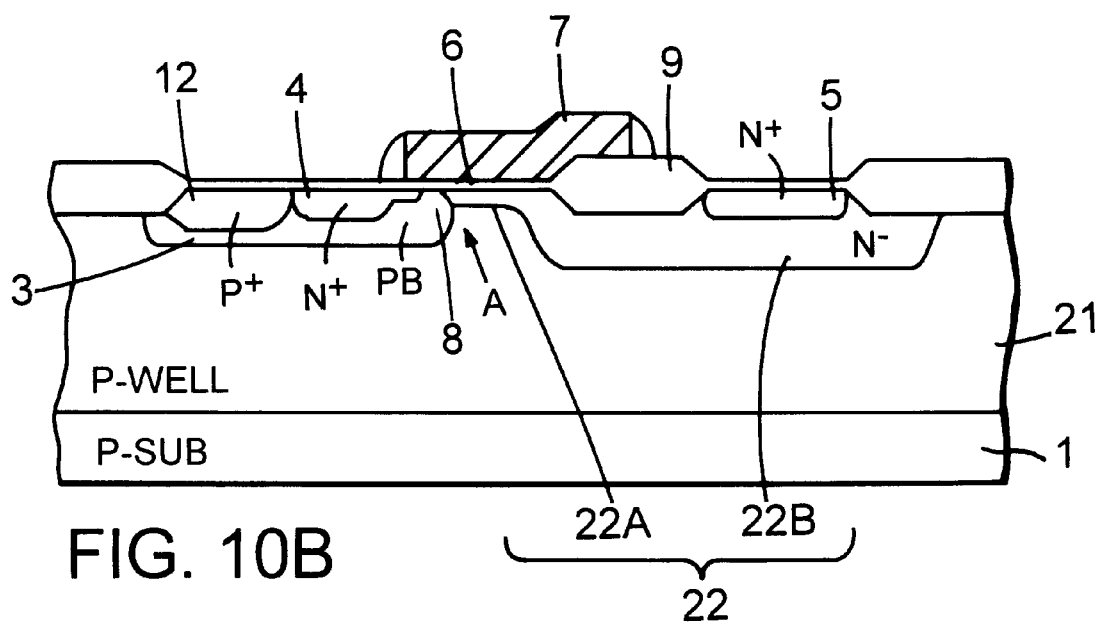

The device structure according to the invention is substantially the same as the conventional device (FIG. 10). In order to avoid repetition of explanation, the explanation will be simplified without explaining the illustrated structure and referring like reference numerals to like parts in the conventional structure.

FIG. 10 shows an N-channel type LDMOS transistor as an example of LDMOS transistor. Although the structure of a P-type LDMOS transistor structure is not explained here, it is well known that the same structure can be adopted except for its conduction type.

First, in FIG. 1, after a pad oxide film 30 has been formed on a P-type semiconductor substrate 1, using a photoresist film 31 as a mask, two kinds of N-type impurities (e.g. arsenic ions and phosphorus ions) are ion-implanted into a P type well region 21 to form a first ion-implanted layer 32 (one-dot chain line) and a second ion-implanted layer 33 (dotted line). These N-type impurities serve to form an N⁻ layer 22 constituting a drift region in later steps. In this step, the arsenic ions are implanted under the condition of an accelerating voltage of about 160 KeV and a dose of $3 \times 10^{12}/cm^2$, whereas the phosphorus ions are implanted under the conduction of the accelerating voltage of about 50 KeV and dose of $4 \times 10^{12}/cm^2$.

Figure 2:
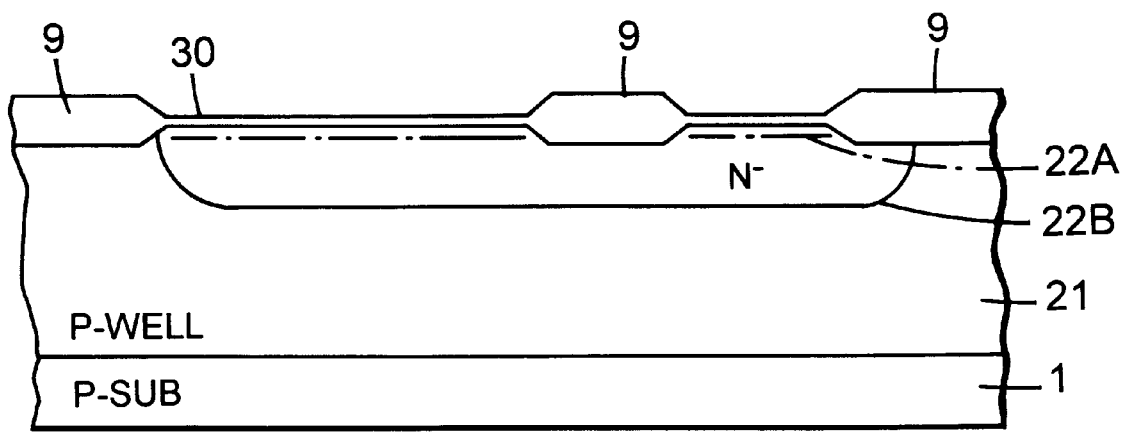

In FIG. 2, using a silicon nitride film (not shown) formed on the substrate as a mask, a certain region of the substrate surface is selectively oxidized to form LOCOS oxide films 9 each having a thickness of about 7300 A. Simultaneously, because of a difference in the diffusion coefficient between the diffused arsenic ions and phosphorus ions, the arsenic ions are diffused into the substrate 1 so that the first N⁻ layer 22 (illustrated one-dot chain line) is formed in a relatively substrate-surface layer. The phosphorus ions are diffused into the substrate 1 so that the second N⁻ layer 22B (illustrated by solid line) is formed at a relatively deep position in the P type well region 21.

Figure 3:
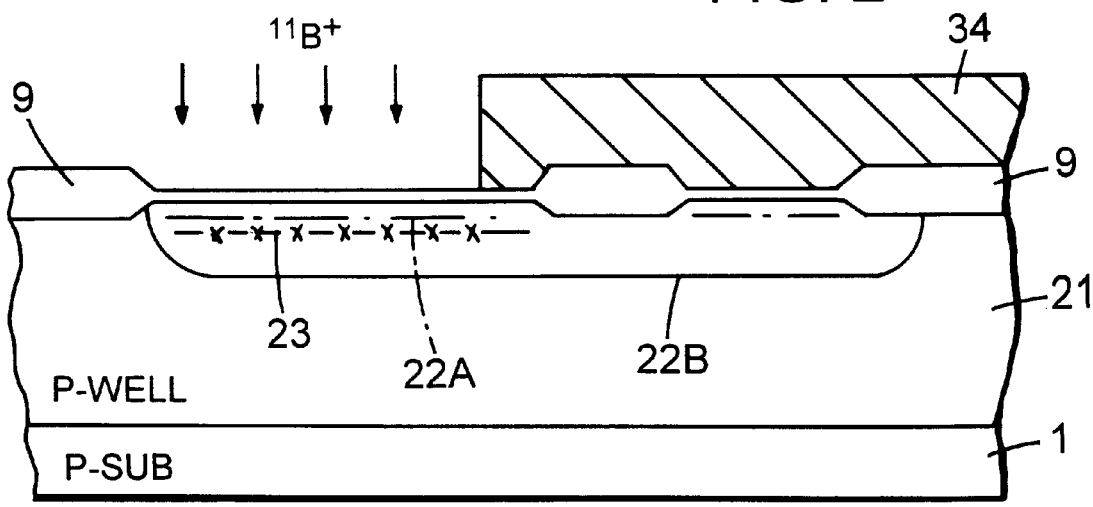

In FIG. 3, after a photoresist film 34 has been formed on the substrate 1 of a region where a drain is to be formed (referred to as "drain-forming region"), using the photoresist film 34 as a mask, P-type impurities (e.g. boron ions) are ion-implanted in the substrate-surface layer of a region where a source is to be formed (referred to as "source-forming region). Thus, a third ion-implanted layer 23 (illustrated by xxx mark) is formed.

Figure 4:
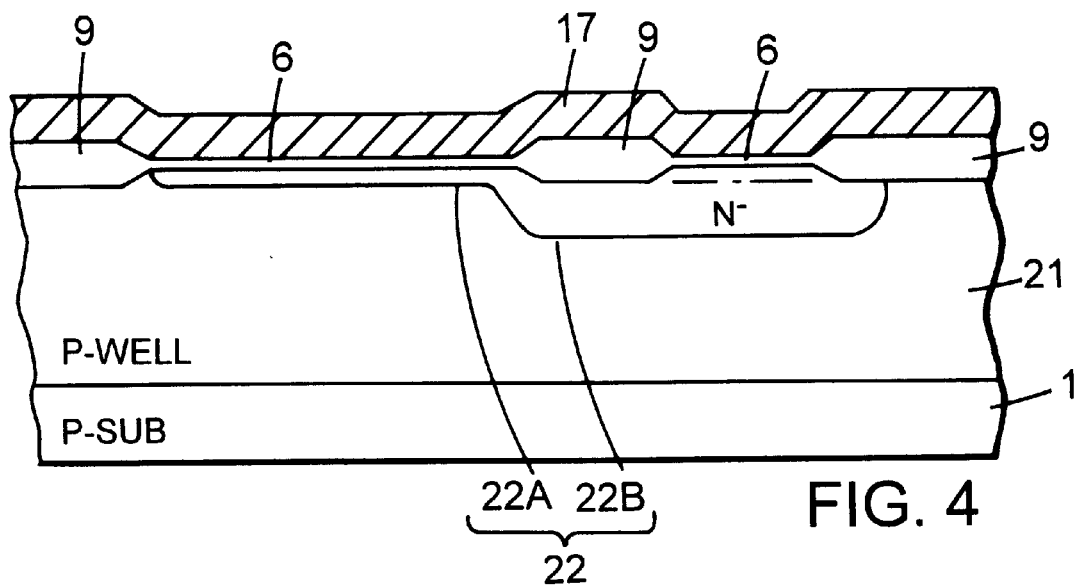

In FIG. 4, the substrate surface is pyro-oxidized at about 850° C. to form a gate oxide film 6 having a thickness of about 800 A on the substrate 1. Thereafter, a polysilicon film 17 (or amorphous silicon film) having a thickness of 2000–3000 A is formed from the gate oxide insulating film 6 on the entire surface of the substrate inclusive of the LOCOS oxide film 9.

Subsequently, diffusion of the boron ions which have been implanted in the third ion-implant layer 23 is executed.

Figure 9:
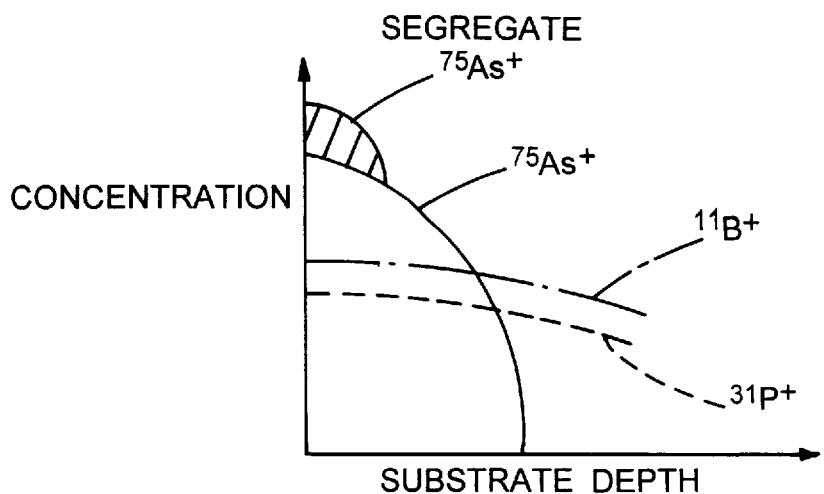
FIG. 9 is a graph showing concentration of various ions for explaining the theory of forming a drift region according to the invention.

Through this diffusion processing, the phosphorus ions constituting the second N⁻ layer 22B of the source-forming region are canceled by the diffused boron ions, the second N⁻ layer 22B disappears. In this step, for example, after the boron ions are implanted under the condition of an accelerating voltage of 80 KeV and dose of $8 \times 10^{12}/cm^2$, they are diffused for two hours in an atmosphere of $N_2$ in a range between 1000° C. and 1150° C., preferably at 1100° C. Now, FIG. 9 is a graph showing the distribution of the impurity concentration when arsenic ions (illustrated by solid line), phosphorus ions (illustrated by dotted line) and boron ions (illustrated by one-dot chain line) are diffused, respectively. As seen from the graph, the concentration distribution originating from the phosphorus ions are canceled by its merging with that from the boron ions.

In this way, in accordance with the present invention, using the difference in a diffusion coefficient between the arsenic ions and phosphorus ions when the drift region is formed, the second N⁻ layer 22B of the source-forming region formed at a deep position of the substrate is caused to disappear by diffusing the boron ions implanted in the subsequent step. Thus, only the first N⁻ layer 22A formed in the substrate surface layer is left in the source-forming region. Accordingly, the semiconductor device with reduced "on" resistance reduced can be manufactured through a relatively simple manufacturing process.

In addition, the step of diffusing the boron ions previously implanted into the substrate-surface layer is executed after the thermal oxidation step for forming the gate insulating film 6 has been executed. For this reason, it is possible to prevent occurrence of the conventional problem that the P-type body region 3 cannot diffuse sufficiently owing to the concentration of the N⁻ layer 22 of the drift region so that the channel region 8 cannot be to have a suitable size.

Specifically, in the conventional process in which the steps of implanting the boron ions in the substrate-surface layer and of diffusing them are successively executed and thereafter the step of thermal oxidation for forming the gate insulating film 6 is executed, during the thermal oxidation, the arsenic ions in the first N⁻ layer 22A (arsenic ions diffused) are segregated on the substrate surface so that the P-type body region 3 cannot diffuse sufficiently owing to the segregated arsenic ions so that the channel region cannot be to have a suitable size. However, the present invention can avoid occurrence of such a problem, thereby providing a method of manufacturing a semiconductor device which can satisfy the requirements of the high withstand voltage and reduced on-resistance.

Incidentally, in the above embodiment, the step of diffusing the boron ions is executed after the polysilicon film 17 for forming the gate electrode has been formed on the gate insulating film 6. However, this step may be executed after immediately after the gate insulating film 6 has been formed, immediately after the polysilicon film 17 has been made conductive (described later), or in a further later step. In short, the step of diffusing the boron ions may be executed after the thermal oxidation for forming the gate insulating film has been executed. In the case that the step of diffusing is executed immediately after forming the gate insulating film 6, B diffusion can be executed during applying an inert gas such as $N_2$ gas immediately after oxidation. According to the process, pollution is not happened and operation efficiency can be improved, because of operation within the furnace without exposing from the furnace.

Further, it should be noted that the step of diffusing the boron ions is preferably executed after the polysilicon film 17 for forming the gate electrode has been formed and before the polysilicon film 17 is made conductive (by phosphorus-doping from the thermal diffusion source of $POCl_3$ or by ion-implantation of N-type impurities). Specifically, where the polysilicon film 17 made conductive is present on the gate insulating film 6, the impurities contained in the polysilicon film 17 exude into the gate insulating film 6 so that the gate insulating film appears a phosphorus-doped film. Meanwhile, the "viscous flow" of the phosphorus-doped insulating film which occurs at a lower temperature than the melting point) occurs at about 900° C. whereas that of the non-doped insulating film normally occurs at about 1400° C. Therefore, the phosphorus-doped insulating film is exposed to the atmosphere of diffusing the boron ions at a temperature of 1100° C. so that pointed deposits continue like a bridge, thereby deteriorating the withstand voltage of the oxide film. The state where pointed deposits continue like a bridge is called "Oxide Ridge" (coinage of Oxide film and Bridge with "B" removed).

Further, where the step of diffusing the boron ions is executed after the polysilicon film 17 has been made conductive, the concentration distribution of the polysilicon film 17 (gate electrode 7) will vary.

Therefore as a file for forming the gate electrode 7, non-doped polysilicon film instead of doped polysilicon film is required to be used.

Thus, as described above, in accordance with the invention, the step of diffusing the boron ions is executed after the gate insulating film 6 and the polysilicon film 17 have been formed and before the polysilicon film is made conductive, thereby solving the conventional problem and avoiding occurrence of the above phenomenon.

In this way, in the invention, by a minimum process change of only rearranging the order of manufacturing steps (simulation of optimizing a process condition such as ion-implantation and diffusion may be included), the above problem can be solved.

The following techniques can be proposed in order to solve the above problem. First, a technique can be proposed which increases the dose of boron ions in the P-type body region 3. However, this technique excessively increases the concentration of the P-type body region 3, thereby also increasing the threshold voltage. This hinders realization of the low on-resistance which is a feature of the LDMOS transistor. Secondly, another technique can be proposed which changes the thermal processing during the diffusion of the P-type body region 3. However, this technique varies the impurity concentration distribution of another transistor (the DMOS transistor is not necessarily required), and hence requires a considerable process change of setting the impurity concentration distribution again.

As described above, the above proposed techniques have disadvantages. On the other hand, the invention can solve the problem without doing the considerable process change.

Figure 5:
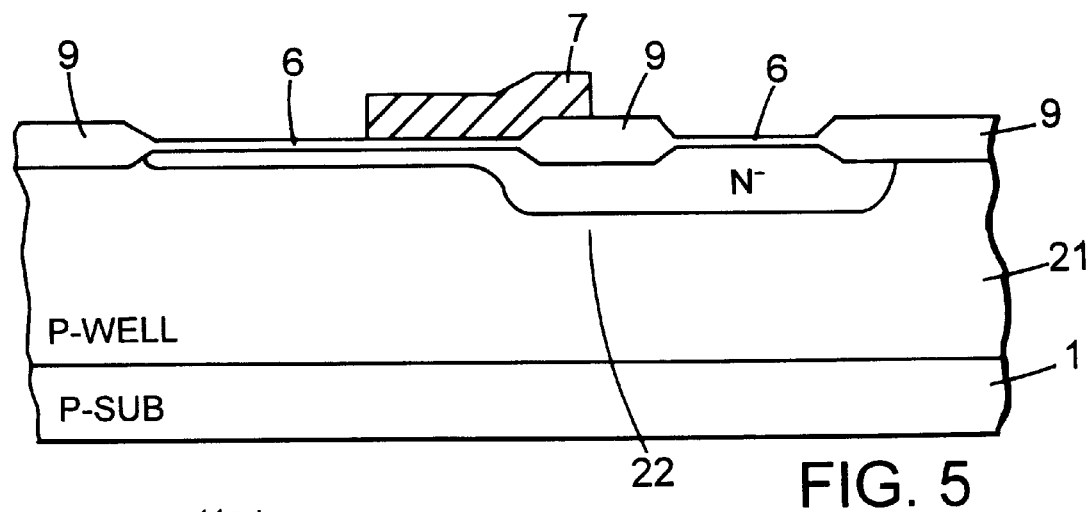

Returning to the process of manufacturing the semiconductor device, after the polysilicon film 17 has been made conductive using $POCl_3$ as a thermal diffusion source, as shown in FIG. 5, a gate electrode patterned so as to extend from gate insulating film 6 to the LOCOS oxide film 9.

Figure 6:
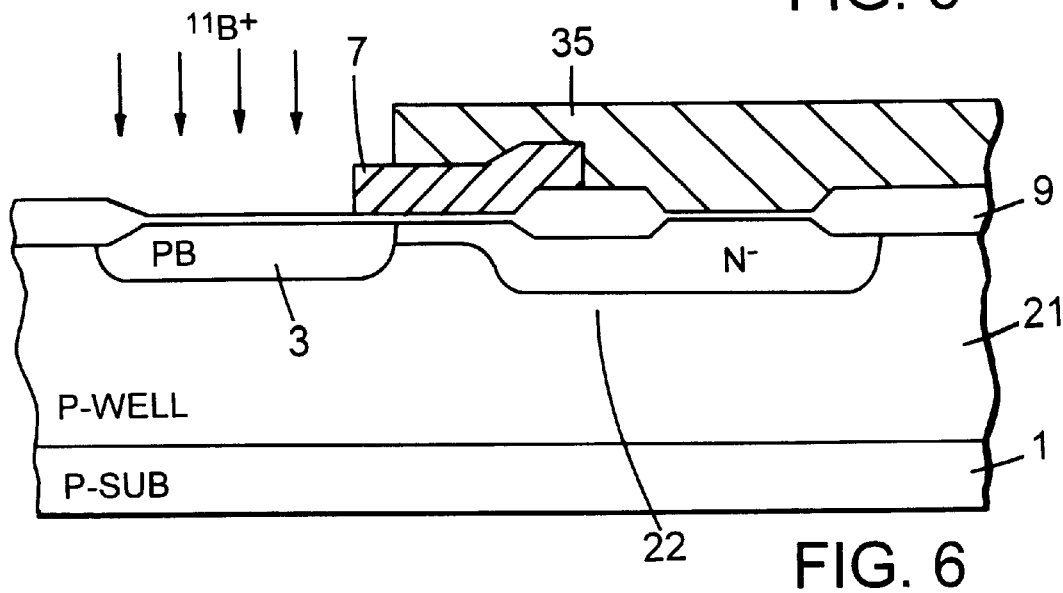

Next, in FIG. 6, using, as a mask, a photoresist film 35 formed so as to cover the gate electrode 7 and drain region, P-type impurities (e.g. boron ions) are implanted and diffused, thereby forming the P-type body region 3 to be adjacent to the one edge of the gate electrode 7. Incidentally, in this step, after the boron ions have been implanted under the condition of an accelerating voltage of about 40 KeV and dose of $5 \times 10^{13}/cm^2$, they are diffused for two hours at 900–1100° C. preferably 1050° C.

Figure 7:
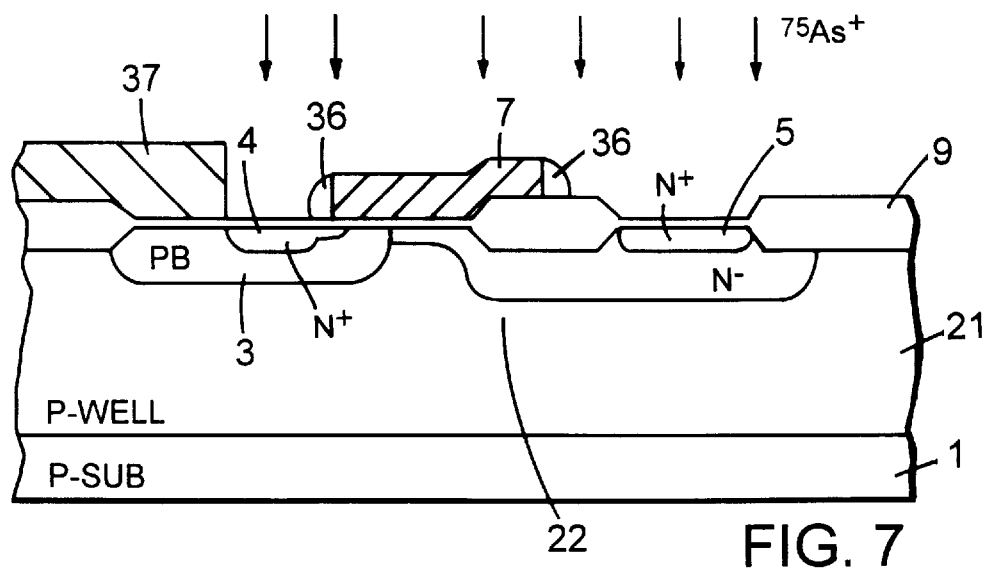

Further, in FIG. 7, using, as a mask, a photoresist mask 37 having openings on the source region to be formed in the P-type body region 3 and the drain region, N-type impurities are diffused to form N-type diffused regions 4 and 5 which constitute the source and drain regions, respectively. In this step, where the source/drain regions are formed having an LDD structure, first, with the photoresist film 35 removed in FIG. 6, for example, phosphorus ions are implanted under the condition of an accelerating voltage of 40 KeV and dose of $3.5 \times 10^{13}/cm^2$, as shown in FIG. 7, a side wall spacer film 36 is formed on the side wall of the gate electrode 7. Using the photoresist film 37 as a mask, for example, arsenic ions are implanted under the condition of an accelerating voltage of 80 KeV and dose of $5 \times 10^{15}/cm^2$. Incidentally, in this embodiment, it is needless to say that the source/drain region should not be limited to the LDD structure.

Figure 8:
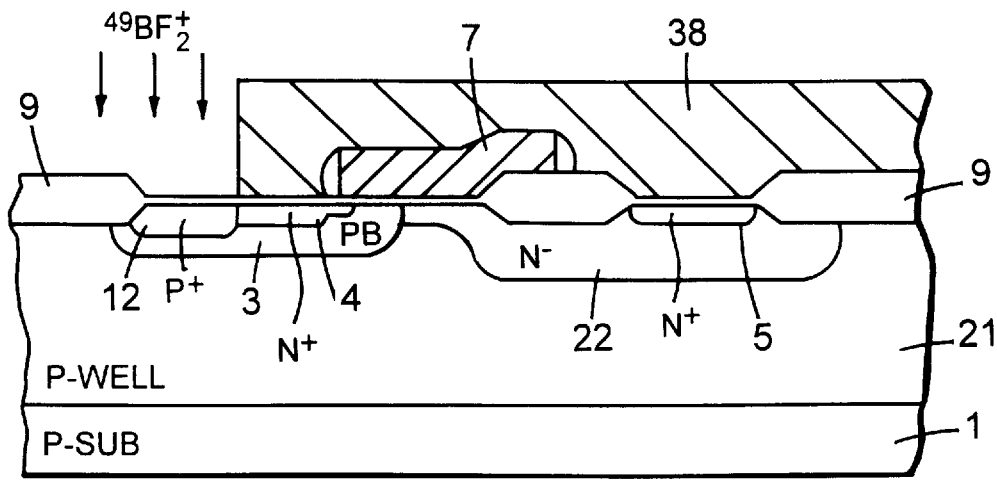

In FIG. 8, in order to form a P-type diffused region 12 adjacent to the N-type diffused region for the purpose of assuming the potential of the P-type body region 3, using a photoresist film as a mask, P-type impurities (e.g. boron difluoride ions) are implanted to form the P-type diffused region 12. In this step, the boron difluoride ions are implanted under the conduction of an accelerating voltage of 60 KeV and dose of $4 \times 10^{15}/cm^2$.

Subsequently, like the conventional structure, after the source electrode 10 and drain electrode 11 have been formed, an interlayer insulating film 13 is formed to complete the semiconductor device.

In the above embodiment, impurity ion is implanted by ion-implantation, but impurity ion can be supplied from gas phase or solid phase.

What is claimed is:

1. A method of manufacturing a semiconductor device which includes a source region, a channel region, a drain region, a gate electrode formed on the channel region through a gate insulating film and a drift region formed between the channel region and the drain region, wherein the process of forming the drift region comprises the steps of:
   ion-implanting and diffusing at least two kinds of second conduction type impurities having different diffusion coefficients in a semiconductor layer with a first conduction type;
   ion-implanting at least one kind first conduction type impurities having a diffusion coefficient substantially equal to or larger than that of at least one of said second conduction type impurities; and
   diffusing the first conduction type impurities after the gate insulating film has been formed.

2. A method of manufacturing a semiconductor device according to claim 1, wherein the step of ion-implanting at least one kind first conduction type impurities is executed after said second conduction type impurity has ion-implanted and diffused.

3. A method of manufacturing a semiconductor device according to claim 2, wherein the step of diffusing the first conduction type impurities is executed after a film for forming the gate electrode has been formed.

4. A method of manufacturing a semiconductor device according to claim 1, wherein said step of forming a drift region is the step of diffusing so that a diffusion depth is shallow below the gate electrode and deep in the vicinity of the drain region diffusing the first conduction type impurities.

5. A method of manufacturing a semiconductor device according to claim 4, comprising the steps of:
   ion-implanting two kinds of second conduction type impurities into a first conduction type well region within a semiconductor substrate so as to form a second conduction type lightly doped layers which are formed into a drift region via later steps;
   ion-implanting first conduction impurities selectively in said substrate-surface layer of a source-forming region in the substrate;
   forming a polysilicon film on the entire substrate surface;
   diffusing the first conduction type impurities ion-implanted in said substrate-surface layer of the source-forming region so that the first conduction type impurities thus diffused cancel the second conduction type lightly doped layers at the relatively deep position within said first conduction type well region of said source-forming region;
   forming a gate electrode by patterning said polysilicon film made conductive;
   forming a first conduction type body region to be adjacent to the one edge of said gate electrode by ion-implanting and diffusing the first conduction type impurities using a first mask formed to cover said gate electrode and drain-forming region; and
   forming source/drain regions by ion-implanting the second conduction type impurities using a second mask having openings on the source-forming region formed in said first conduction type body region and the drain-forming region.

6. A method of manufacturing a semiconductor device according to claim 5, wherein after the step of ion two kinds of second conduction type impurities, the step of forming a LOCOS oxide film by selectively oxidizing a certain region on the substrate is executed so as to cause diffusing the impurities to form the second conduction type lightly doped layers at a relatively deep position and a relatively substrate-surface layer in the first conduction type well region on the basis of a difference between diffusion coefficients of the two kinds of second conduction type impurities.

7. A method of manufacturing a semiconductor device according to claim 6, the step of forming a gate electrode comprises the steps of:
   forming a non-doped polysilicon film;
   implanting an impurity into the non-doped polysilicon: and
       diffusing the impurity into the non-doped polysilicon by heat treatment to make conductive,
       and the step of diffusing the first conduction type impurities is executed prior to the step of implanting an impurity into the non-doped polysilicon.

8. A method of manufacturing a semiconductor device according to claim 6, the step of forming a gate electrode comprises the steps of:
   forming a non-doped polysilicon film;
   forming a $POCl_3$ film as a diffusion source on the non-doped polysilicon film: and
       diffusing a P ion into the non-doped polysilicon by heat treatment to make conductive,
       and the step of diffusing the first conduction type impurities is executed prior to the step of forming a $POCl_3$ film.

9. A method of manufacturing a semiconductor device according to claim 1, the step of ion-implanting second conduction type impurities comprises a step of ion-implanting As and P ions, and the step of ion-implanting a first conduction type impurities comprises a step of ion-implanting Br ion.

10. A method of manufacturing a semiconductor device according to claim 9, the step of forming a gate insulating layer comprises a step of pyro-oxidation step.

11. A method of manufacturing a semiconductor device according to claim 10, the step of ion-implanting a first conduction type impurities comprises a step of ion-implanting Br ion.

12. A method of manufacturing a semiconductor device according to claim 11, the step of diffusing a first conduction type impurities comprises a step of heating at a temperature in a range between 1000–1150° C.

13. A method of manufacturing a semiconductor device according to claim 2, the step of diffusing a first conduction type impurities comprises a step of heating at a temperature condition so that no segregation of the second conduction type of impurity on the surface of the substrate.

* * * * *